(12) United States Patent
Kuan et al.

(10) Patent No.: US 7,679,454 B2
(45) Date of Patent: Mar. 16, 2010

(54) HYBRID PHASE-LOCKED LOOP

(75) Inventors: Chi-Kung Kuan, Tao-Yuan Hsien (TW); Yu-Pin Chou, Miao-Li Hsien (TW); Yi-Teng Chen, Kao-Hsiung (TW)

(73) Assignee: Realtek Semiconductor Corp., Hsinchu (TW)

( * ) Notice: Subject to any disclaimer, the term of this patent is extended or adjusted under 35 U.S.C. 154(b) by 94 days.

(21) Appl. No.: 11/874,209

(22) Filed: Oct. 18, 2007

(65) Prior Publication Data

US 2008/0094145 A1 Apr. 24, 2008

(30) Foreign Application Priority Data

Oct. 23, 2006 (TW) ................ 95139013 A

(51) Int. Cl.
*H03L 7/00* (2006.01)
(52) U.S. Cl. ................ 331/11; 331/2; 331/16; 331/18; 331/20
(58) Field of Classification Search .......... 331/2, 331/11, 16, 18, 20
See application file for complete search history.

(56) References Cited

U.S. PATENT DOCUMENTS

| | | | |
|---|---|---|---|
| 4,443,887 A | 4/1984 | Shiramizu | |
| 6,219,397 B1 * | 4/2001 | Park | 375/376 |
| 6,310,498 B1 * | 10/2001 | Larsson | 327/158 |
| 6,600,345 B1 | 7/2003 | Boutaud | |
| 6,686,784 B2 * | 2/2004 | Chang | 327/157 |
| 6,693,969 B1 | 2/2004 | Montalvo et al. | |
| 6,703,878 B2 | 3/2004 | Soumyanath et al. | |
| 6,711,227 B1 * | 3/2004 | Kaylani et al. | 375/372 |
| 2002/0176520 A1 | 11/2002 | Heegard et al. | |
| 2003/0131155 A1 | 7/2003 | Hsu et al. | |
| 2004/0239434 A1 | 12/2004 | Casagrande | |

* cited by examiner

*Primary Examiner*—Joseph Chang
*Assistant Examiner*—Jeffrey Shin
(74) *Attorney, Agent, or Firm*—Thomas, Kayden, Horstemeyer & Risley

(57) ABSTRACT

A phase-locked loop (PLL) including a digital PFD, a digital loop filter, a decision circuit, a fractional-N PLL, and a frequency divider is provided. The digital PFD generates a first detection signal according to the phase error or frequency difference between an input signal and a feedback signal. The digital loop filter generates a first control signal according to the first detection signal. The decision circuit generates a divisor value according to the first control signal. The fractional-N PLL generates an oscillation signal according to the divisor value and a reference signal. The frequency divider divides the oscillation signal to produce the feedback signal. The fractional-N PLL includes a fractional-N frequency divider for generating a frequency-divided signal for use in tracking the reference signal according to the divisor value by employing phase swallow means.

19 Claims, 3 Drawing Sheets

HYBRID PHASE-LOCKED LOOP

BACKGROUND OF THE INVENTION

1. Field of the Invention

The present invention relates to a phase-locked loop (PLL), and more particularly, to a PLL for utilizing a fractional-N PLL as a signal source for generating an oscillation signal.

2. Description of the Prior Art

Please refer to FIG. 1. FIG. 1 is a diagram of a prior art analog PLL 100. As shown in FIG. 1, the PLL 100 comprises a phase/frequency detector (PFD) 110, a charge pump 120, a low-pass filter 130, a voltage-controllable oscillator (VCO) 140, and a frequency divider 150. The PFD 110 is utilized for detecting a phase error or frequency difference between an input signal S_in and a feedback signal S_fb. The charge pump 120 is utilized for generating an output current according to a detection result generated from the PFD 110. The low-pass filter 130 is utilized for generating a control voltage CV according to the output current. The VCO 140 is utilized for generating an oscillation signal S_vco according to the control voltage CV. The frequency divider 150 is utilized for performing a frequency dividing operation upon the oscillation signal S_vco to generate the feedback signal S_fb.

The prior art PLL 100 faces a dilemma when it comes to circuit design. In order to maintain the reliability of the PLL 100, the loop bandwidth of the PLL 100 should be designed to be narrow enough to avoid the effect of jitters of the input signal S_in. However, this will reduce the ability of the PLL 100 to track the input signal S_in and to suppress the effect of jitters of the oscillation signal S_vco generated by the VCO 140. The dilemma becomes more serious when the required frequency of the oscillation signal S_vco differs from the frequency of the input signal S_in by a large degree. For example, when the PLL 100 is applied into a control circuit in an LCD device, the frequency of the input signal S_in (i.e. a horizontal synchronous signal Hsync) is almost 15 KHz~100 KHz; however, the required frequency of the oscillation signal S_vco is almost 13 MHz~210 MHz. The required frequency of the oscillation signal S_vco may be several thousand times that of the horizontal synchronous signal Hsync. In this situation, it is obvious that the prior art analog PLL 100 cannot simultaneously overcome the problems of poor system reliability, and poor ability to track an input signal and suppress jitters resulting from the oscillator.

SUMMARY OF THE INVENTION

Therefore one of the objectives of the present invention is to provide a PLL capable of solving the above-mentioned problems.

According to an embodiment of the present invention, a PLL is disclosed, comprising: a digital PFD, a digital loop filter, a decision circuit, a fractional-N PLL, and a frequency divider. The digital PFD is utilized for generating a first detection signal according to the phase error or frequency difference between an input signal and a feedback signal. The digital loop filter is coupled to the digital PFD and utilized for generating a first control signal according to the first detection signal. The decision circuit is coupled to the digital loop filter and utilized for generating a divisor value according to the first control signal. The fractional-N PLL is coupled to the decision circuit and utilized for generating an oscillation signal according to the divisor value and a reference signal. The frequency divider is coupled between the fractional-N PLL and digital PFD, and is utilized for performing a frequency dividing operation upon the oscillation signal to generate the feedback signal. The fractional-N PLL comprises a fractional-N frequency divider for performing a frequency dividing operation upon the oscillation signal to generate a frequency-divided signal utilized for tracking the reference signal according to the divisor value by employing phase swallow means.

According to another embodiment of the claimed invention, a PLL is disclosed, comprising: a digital PFD, a digital loop filter, a decision circuit, a PFD, a loop filter, a controllable oscillator, a fractional-N frequency divider, and a frequency divider. The digital PFD is utilized for generating a first detection signal according to a phase error or frequency difference between an input signal and a feedback signal. The digital loop filter is utilized for generating a first control signal according to the first detection signal. The decision circuit is utilized for generating a divisor value according to the first control signal. The PFD is utilized for generating a second detection signal according to a phase error or frequency difference between a reference signal and a frequency-divided signal. The loop filter is utilized for generating a second control signal according to the second detection signal. The controllable oscillator is utilized for generating at least an oscillation signal according to the second control signal. The fractional-N frequency divider is utilized for performing a frequency dividing operation upon an output signal of the controllable oscillator to generate the frequency-divided signal according to the divisor value by employing phase swallow means. The frequency divider is utilized for performing a frequency dividing operation upon the oscillation signal to generate the feedback signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
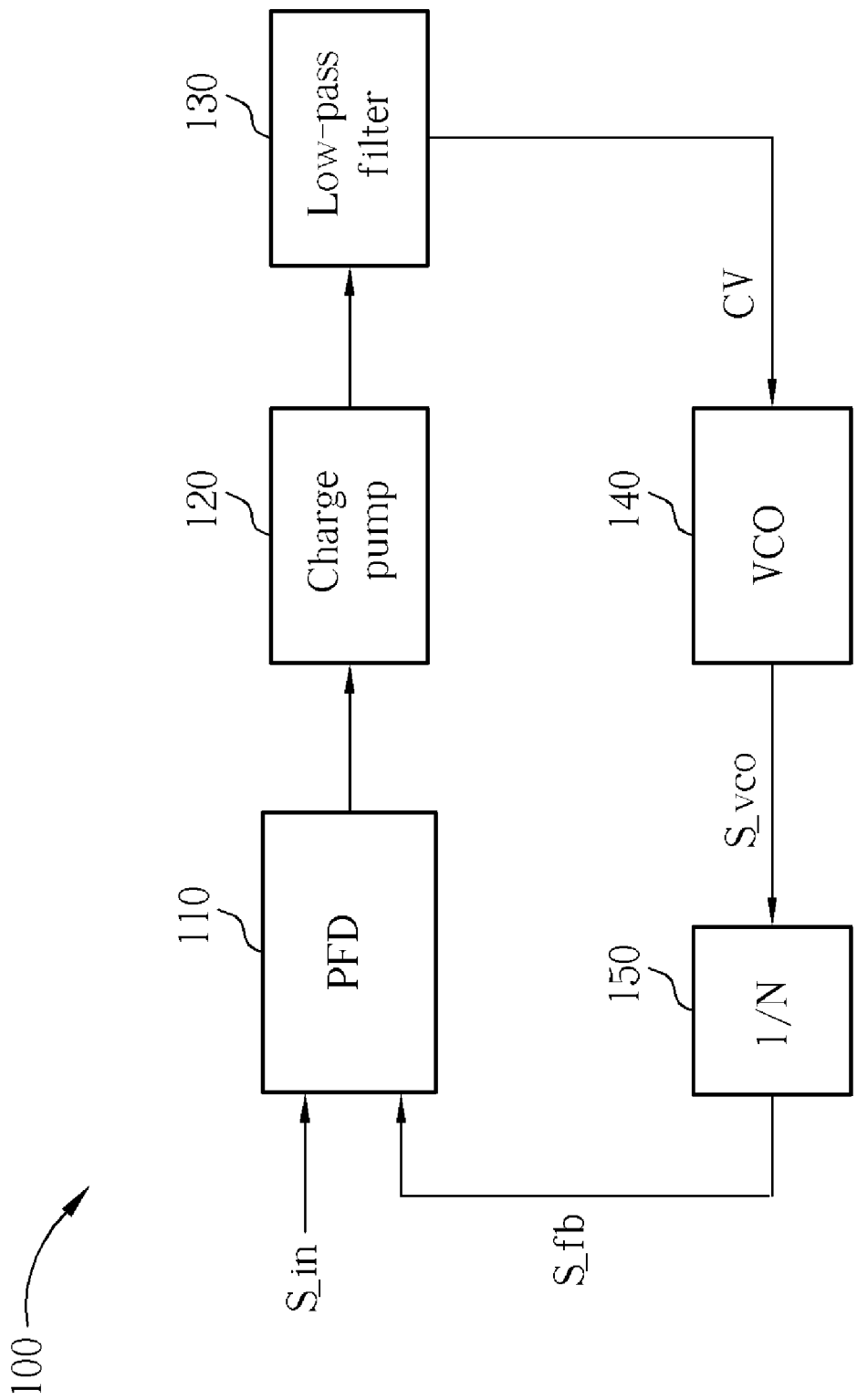
FIG. 1 is a diagram of a prior art analog phase-locked loop (PLL).
Figure 2:
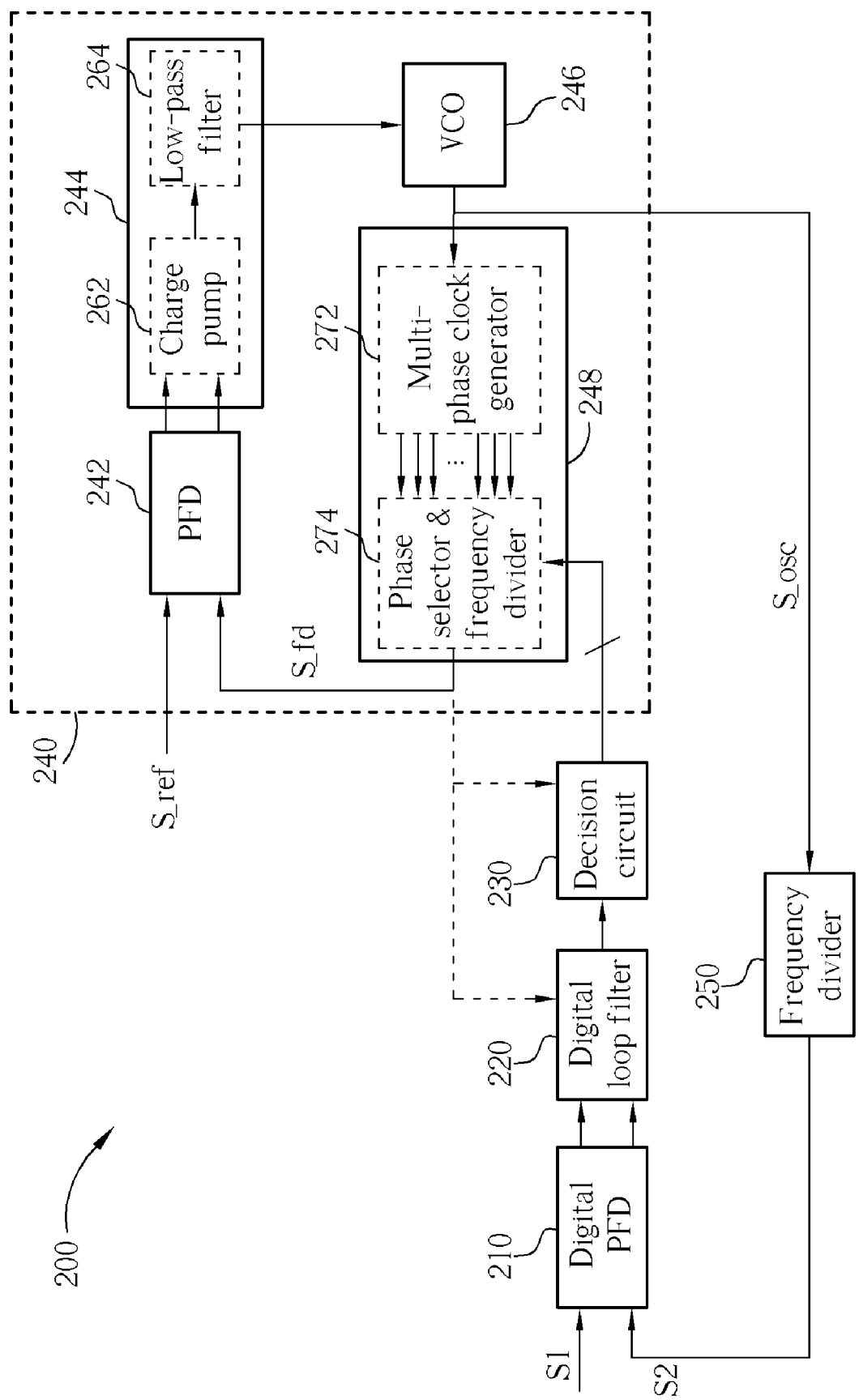
FIG. 2 is a simplified diagram of a PLL according to an embodiment of the present invention.

Please refer to FIG. 2. FIG. 2 is a simplified diagram of a phase-locked loop (PLL) 200 according to an embodiment of the present invention. As shown in FIG. 2, the PLL 200 comprises a digital PFD 210, a digital loop filter 220, a decision circuit 230, a fractional-N PLL 240, a frequency divider 250. The digital PFD 210 is utilized for generating a first detection signal according to a phase error or frequency difference between an input signal S1 and a feedback signal S2. The digital loop filter 220 is utilized for generating a first control signal according to the first detection signal. The decision circuit 230 is utilized for generating a divisor value to control the operation of the fractional-N PLL 240 according to the first control signal. The fractional-N PLL 240 is utilized for generating an oscillation signal S_osc according to the divisor value and a reference signal S_ref. The frequency divider 250 is utilized for performing a frequency dividing operation upon the oscillation signal S_osc to generate the feedback signal S2. In practice, the digital loop filter 220 can be implemented by a PI control circuit.

In this embodiment, the fractional-N PLL 240 comprises a PFD 242, a loop filter 244, a controllable oscillator 246, and a fractional-N frequency divider 248. The fractional-N frequency divider 248 performs a frequency dividing operation or a fractional-N frequency dividing operation upon the oscillation signal S_osc outputted from the controllable oscillator 246 for generating a frequency-divided signal S_fd; the frequency-divided signal S_fd to be used in tracking the reference signal S_ref according to the divisor value generated from the decision circuit 230 by employing phase swallow means. The PFD 242 is utilized for generating a second detection signal according to a phase error or frequency difference between the reference signal S_ref and the frequency-divided signal S_fd. The loop filter 244 is utilized for generating a second control signal according to the second detection signal. The controllable oscillator 246 is utilized for controlling the frequency of the oscillation signal S_osc according to the second control signal. In practice, the PFD 242, loop filter 244, and controllable oscillator 246 can all be implemented with analog circuits. For example, the loop filter 244 can be implemented with a charge pump 262 and low-pass filter 264, and the controllable oscillator 246 can be implemented with a voltage-controllable oscillator (VCO).

For solving the problems in circuit design incurred by the prior art analog PLL, the PLL 200 suppresses an effect caused by variations of the input signal S1 by digital processing. In addition, a clock signal (e.g. a quartz oscillation signal) having a frequency being much higher than that of the input signal S1 is used as the reference signal S_ref, and the loop bandwidth of the fractional-N PLL 240 is designed to be wide enough for suppressing an effect caused by variations of the oscillation signal S_osc.

Additionally, the fractional-N frequency divider 248 comprises a multi-phase clock generator 272 and a phase selector and frequency divider 274. The multi-phase clock generator 272 is utilized for generating a plurality of clock signals having different phases according to the oscillation signal S_osc generated from the controllable oscillator 246. The phase selector and frequency divider 274 is coupled to the decision circuit 230 and the PFD 242, and is utilized for selectively outputting one of the clock signals having different phases to generate a phase swallowed signal according to an integer divisor value or a non-integer divisor value outputted from the decision circuit 230, and for performing a frequency dividing operation upon the phase swallow signal to generate the frequency-divided signal S_fd. However, this is not intended to be a limitation of the present invention. For example, the controllable oscillator 246 can also be implemented by a ring oscillator having multiple outputs. The ring oscillator with multiple outputs is utilized for generating a plurality of clock signals having different phases, where the clock signals comprise the oscillation signal S_osc. The multi-phase clock generator 272 is therefore omitted. This also falls within the scope of the present invention.

Figure 3:
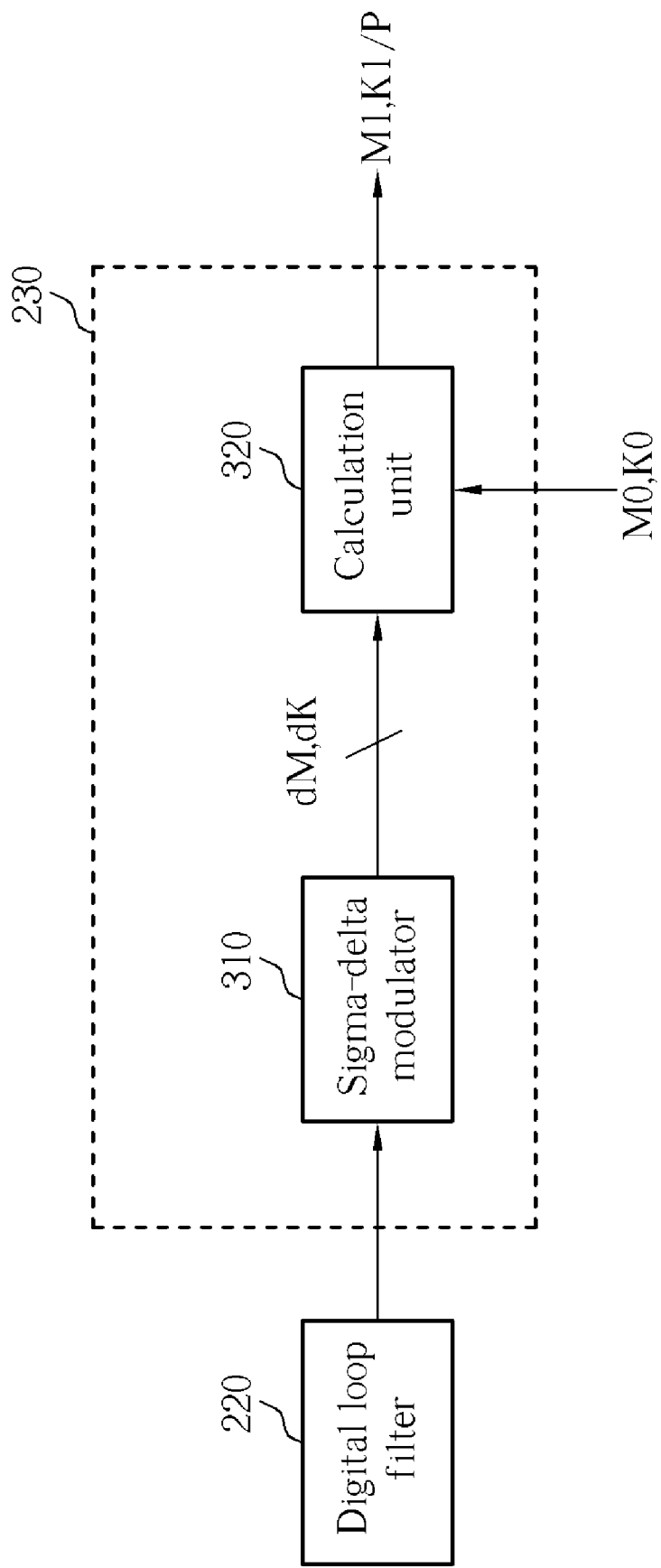
FIG. 3 is a diagram of the decision circuit shown in FIG. 2.

Please refer to FIG. 3. FIG. 3 is a diagram of the decision circuit 230 shown in FIG. 2. As shown in FIG. 3, the decision circuit 230 comprises a sigma-delta modulator (SDM) 310 and a calculation unit 320. The SDM 310 is utilized for generating a modulation value according to the first control signal outputted from the digital loop filter 220. The calculation unit 320 is utilized for generating the divisor value according to the modulation value and a predetermined value. The modulation value is meant to be an adjusting amount for calibrating the divisor value, and the predetermined value is meant to be an initial divisor value. Parameters dM, dK are representative of the integer part and fractional part of the adjusting amount, and parameters M0, K0 are representative of the integer part and fractional part of the initial divisor value, respectively. In practice, the initial divisor value can be calculated by firmware. It is assumed that the multi-phase clock generator 272 in the fractional-N frequency divider 248 generates P clock signals having different phases respectively. As mentioned above, the calculation unit 320 can calculate a divisor value according to the following equation:

$$M1+K1/P=M0+K0/P+(dM+dK/P) \qquad \text{Equation (1)}$$

wherein parameters M1, K1/P represent the integer part and fractional part respectively of the divisor value.

Each time before the frequency dividing operation is performed, the phase selector and frequency divider 274 generates the phase swallowed signal from the plurality of clock signals having different phases according to the divisor value outputted from the calculation unit 320 by employing phase swallow means. The phase selector and frequency divider 274 then performs the frequency dividing operation upon the phase swallowed signal. Therefore, a phase error between the current and preceding frequency-divided signals S_fd outputted from the fractional-N frequency divider 248 is shorter than the length of a period of the oscillation signal S_osc. The ability of the fractional-N PLL 240 for tracking the reference signal S_ref can be improved. Furthermore, the frequency-divided signal S_fd generated by the fractional-N frequency divider 248 can be used as an operating clock signal for driving the digital loop filter 220 and the decision circuit 230 to improve the ability of the PLL 200 for tracking the input signal S1 further.

In practice, the PLL 200 can also be applied in a control circuit in an LCD device. That is, a horizontal synchronous signal Hsync in the LCD device may be the input signal S1, and the oscillation signal S_osc outputted from the fractional-N PLL 240 (or a signal generated by performing a frequency dividing operation upon the oscillation signal S_osc) may be used as a sampling clock signal (or a clock signal having a higher frequency being a multiple of that of the sampling clock signal) for driving an analog-to-digital converter (ADC) in the LCD device. As mentioned above, the PLL 200 can therefore suppress variations of the horizontal synchronous signal Hsync and sampling clock signal to improve an image quality of the LCD device. This also obeys the spirit of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A phase-locked loop (PLL) comprising:
 a digital phase/frequency detector (PFD), for generating a first detection signal according to a phase error or a frequency difference between an input signal and a feedback signal;
 a digital loop filter, coupled to the digital phase/frequency detector, for generating a first control signal according to the first detection signal;
 a decision circuit, coupled to the digital loop filter, for generating a divisor value according to the first control signal, wherein the decision circuit comprises:
  a sigma-delta modulator (SDM), coupled to the digital loop filter, for generating a modulation value according to the first control signal; and
  a calculation unit, coupled to the sigma-delta modulator, for generating the divisor value according to the modulation value and a predetermined value representing an initial divisor value;

a fractional-N PLL, coupled to the decision circuit, for generating an oscillation signal according to the divisor value and a reference signal; and a frequency divider, coupled to the fractional-N PLL and the digital phase/frequency detector, for performing a frequency dividing operation upon the oscillation signal to generate the feedback signal;

wherein the fractional-N PLL comprises a fractional-N frequency divider for generating a frequency-divided signal for use in tracking the reference signal according to the divisor value by employing phase swallow means.

2. The PLL of claim 1, wherein the fractional-N PLL further comprises:

a phase/frequency detector, for generating a second detection signal according to a phase error or a frequency difference between the reference signal and the frequency-divided signal;

a loop filter, coupled to the phase/frequency detector, for generating a second control signal according to the second detection signal; and a controllable oscillator, coupled to the loop filter and the fractional-N frequency divider, for generating the oscillation signal according to the second control signal.

3. The PLL of claim 2, wherein the controllable oscillator is a ring oscillator for generating a plurality of clock signals having different phases comprising the oscillation signal.

4. The PLL of claim 3, wherein the fractional-N frequency divider comprises:

a phase selector and frequency divider, coupled to the decision circuit, the controllable oscillator, and the phase/frequency detector, for selectively outputting the plurality of clock signals to generate a phase swallowed signal according to the divisor value and for performing a frequency dividing operation upon the phase swallowed signal to generate the frequency-divided signal.

5. The PLL of claim 1, wherein a frequency of the reference signal is higher than a frequency of the input signal.

6. The PLL of claim 1, wherein the fractional-N frequency divider comprises:

a multi-phase clock generator, for generating a plurality of clock signals having different phases according to the oscillation signal; and a phase selector and frequency divider, coupled to the decision circuit and the multi-phase clock generator, for selectively outputting the plurality of clock signals to generate a phase swallowed signal according to the divisor value and for performing a frequency dividing operation upon the phase swallowed signal to generate the frequency-divided signal.

7. The PLL of claim 1, wherein the input signal is a horizontal synchronous signal (Hsync).

8. The PLL of claim 1, wherein the digital loop filter is a PI control circuit.

9. A phase-locked loop (PLL) comprising:

a digital phase/frequency detector (PFD), for generating a first detection signal according to a phase error or a frequency difference between an input signal and a feedback signal;

a digital loop filter, coupled to the digital phase/frequency detector, for generating a first control signal according to the first detection signal;

a decision circuit, coupled to the digital loop filter, for generating a divisor value according to the first control signal, wherein the decision circuit comprises a calculation unit for generating the divisor value based on an initial divisor value having an integer part and a fractional part;

a phase/frequency detector, for generating a second detection signal according to a phase error or a frequency difference between a reference signal and a frequency-divided signal;

a loop filter, coupled to the phase/frequency detector, for generating a second control signal according to the second detection signal;

a controllable oscillator, coupled to the loop filter, for generating at least an oscillation signal according to the second control signal;

a fractional-N frequency divider, coupled to the decision circuit, the phase/frequency detector, and the controllable oscillator, for performing a frequency dividing operation upon an output signal of the controllable oscillator to generate the frequency-divided signal according to the divisor value by employing phase swallow means; and a frequency divider, coupled to the controllable oscillator and the digital phase/frequency detector, for performing a frequency dividing operation upon the oscillation signal to generate the feedback signal.

10. The PLL of claim 9, wherein the fractional-N frequency divider comprises:

a multi-phase clock generator, coupled to the controllable oscillator, for generating a plurality of clock signals having different phases according to the oscillation signal; and a phase selector and frequency divider, coupled to the decision circuit, the multi-phase clock generator, and the phase/frequency detector, for selectively outputting the plurality of clock signals to generate a phase swallowed signal according to the divisor value and for performing a frequency dividing operation upon the phase swallowed signal to generate the frequency-divided signal.

11. The PLL of claim 9, wherein the controllable oscillator is a ring oscillator for generating a plurality of clock signals having different phases including the oscillation signal.

12. The PLL of claim 11, wherein the fractional-N frequency divider comprises:

a phase selector and frequency divider, coupled to the decision circuit, the controllable oscillator, and the phase/frequency detector, for selectively outputting the plurality of clock signals to generate a phase swallowed signal according to the divisor value and for performing a frequency dividing operation upon the phase swallowed signal to generate the frequency-divided signal.

13. The PLL of claim 9, wherein the input signal is a horizontal synchronous signal (Hsync).

14. The PLL of claim 9, wherein the decision circuit comprises:

a sigma-delta modulator, coupled to the digital loop filter, for generating a modulation value according to the first control signal, wherein the calculation unit coupled to the sigma-delta modulator and further determines the divisor value according to the modulation value.

15. The PLL of claim 14, wherein the decision circuit utilizes the modulation value to calibrate the divisor value.

16. The PLL of claim 9, wherein the loop filter comprises a charge pump and a low-pass filter.

17. The PLL of claim 9, wherein a frequency of the reference signal is higher than a frequency of the input signal.

18. The PLL of claim 9, wherein the digital loop filter is a PI control circuit.

19. The PLL of claim 9, wherein the divisor value comprises an integer part and a fractional part.

* * * * *